United States Patent [19]
Endo

[11] Patent Number: 5,315,139
[45] Date of Patent: May 24, 1994

[54] POWER SEMICONDUCTOR INTEGRATED CIRCUIT DEVICE WITHOUT CONCENTRATION OF ELECTRIC FIELD

[75] Inventor: Koichi Endo, Tokyo, Japan

[73] Assignee: Kabushiki Kaisha Toshiba, Kawasaki, Japan

[21] Appl. No.: 80,535

[22] Filed: Jun. 24, 1993

[30] Foreign Application Priority Data

Jun. 24, 1992 [JP] Japan ................... 4-165908
Jun. 14, 1993 [JP] Japan ................... 5-141788

[51] Int. Cl.$^5$ .................. H01L 27/02; H01L 29/34; H01L 29/40
[52] U.S. Cl. .................. 257/409; 257/364; 257/378; 257/380; 257/401; 257/489; 257/491; 257/630
[58] Field of Search .............. 257/364, 378, 379, 380, 257/401, 409, 488, 489, 491, 630

[56] References Cited

U.S. PATENT DOCUMENTS

| | | | |
|---|---|---|---|
| 4,157,563 | 6/1979 | Bosselaar | 257/489 |
| 4,707,719 | 11/1987 | Whight | 257/489 |
| 5,086,332 | 2/1992 | Nakagawa et al. | 257/489 |

FOREIGN PATENT DOCUMENTS

| | | |
|---|---|---|
| 0077072 | 4/1983 | European Pat. Off. . |
| 0190423 | 8/1986 | European Pat. Off. . |
| 8503167 | 7/1985 | PCT Int'l Appl. . |

*Primary Examiner*—Ngan Ngo
*Attorney, Agent, or Firm*—Oblon, Spivak, McClelland, Maier & Neustadt

[57] ABSTRACT

There is provided a power semiconductor integrated circuit device without lowering a breakdown voltage of a pn junction located below a wiring layer to which a high voltage is applied. The device includes an N$^-$-type semiconductor substrate which is provided with an N$^+$-type region and a P$^+$-type region to form, for example, a lateral diode. An insulating film is formed over the substrate surface, on which a wiring layer is provided so as to be connected to the N$^+$-type region and to pass over the P$^+$-type region. A film resistor connected between the N$^+$-type region and the P$^+$-type region is formed in the insulating film so as to be crossed by the wiring layer at least once.

14 Claims, 8 Drawing Sheets

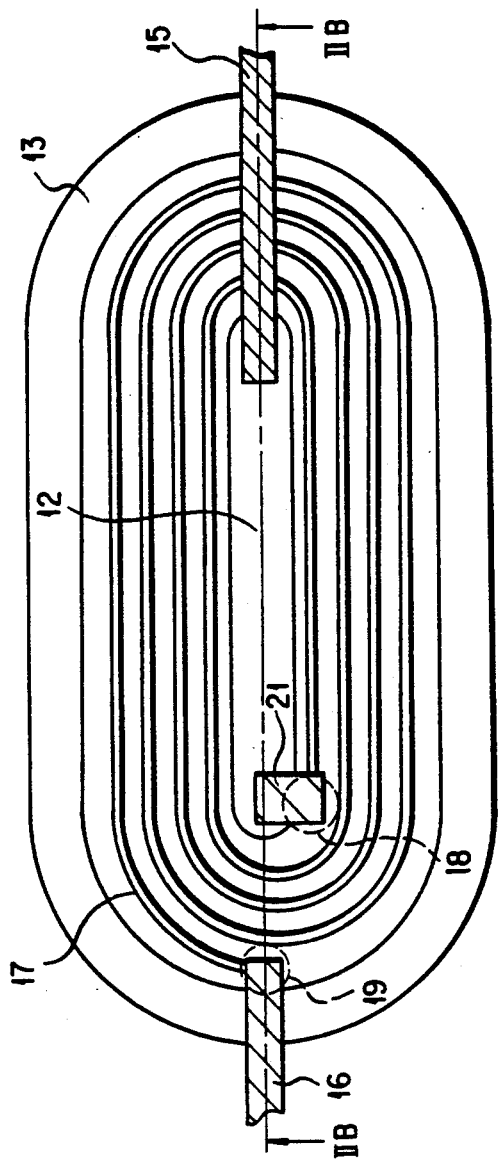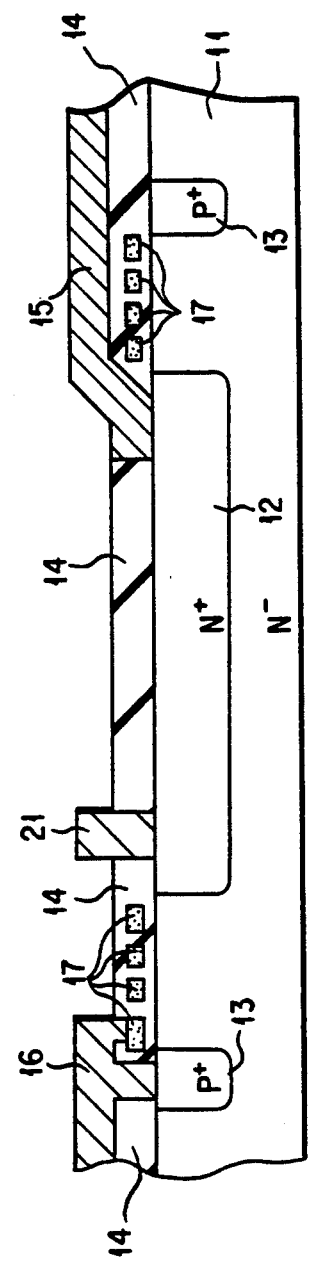
FIG. 2A
FIG. 2B

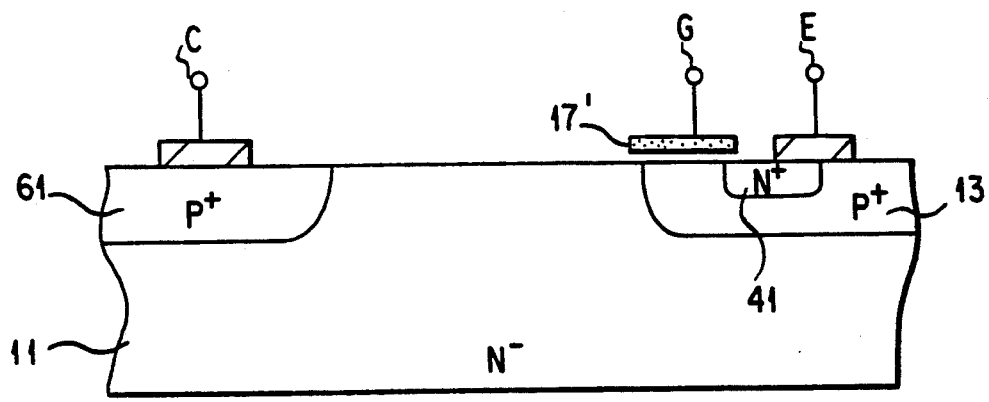
F I G. 6
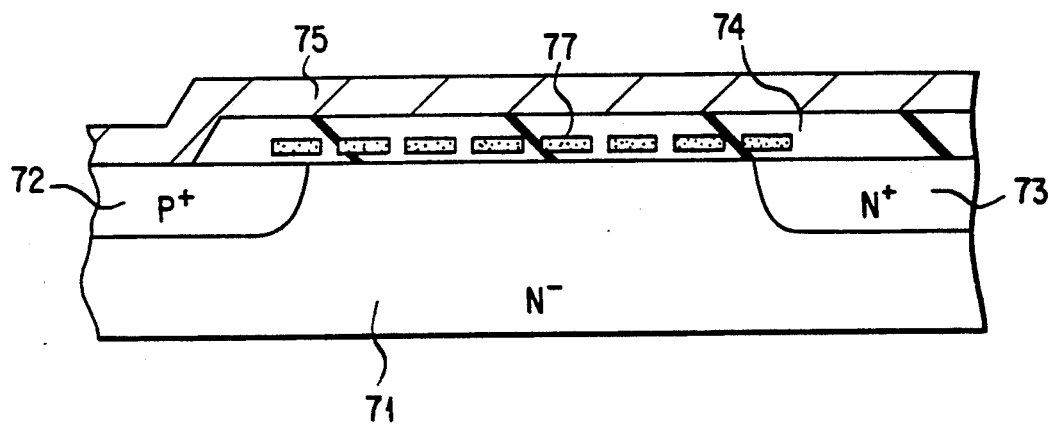
F I G. 7A
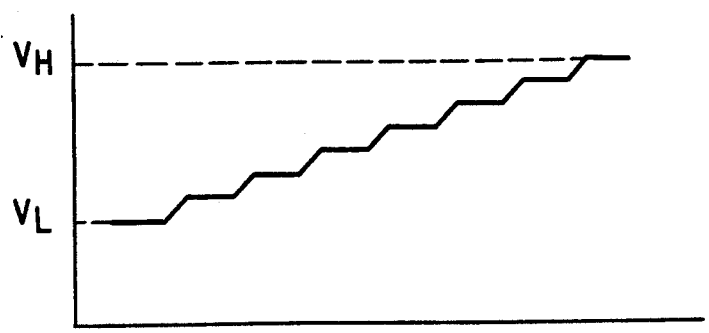
F I G. 7B

POWER SEMICONDUCTOR INTEGRATED CIRCUIT DEVICE WITHOUT CONCENTRATION OF ELECTRIC FIELD

BACKGROUND OF THE INVENTION

1. Field of the Invention

The present invention relates to a power semiconductor integrated circuit device, and more particularly, to a power semiconductor integrated circuit device which is less affected by a voltage applied to a wiring layer.

2. Description of the Related Art

Lateral semiconductor devices such as FRDs (Fast Recovery Diode), power bipolar transistors, power MOS transistors, and IGBTs, to which a high voltage is applied, have been used in a power semiconductor integrated circuit device including a three-phase full bridge circuit, a rectifying circuit, a switching regulator, a high-side switching circuit, and a low-side switching circuit. In the power semiconductor integrated circuit device, a potential difference between two diffused layers can rise to several hundreds volts or more upon the application of a high voltage.

FIG. 8 shows an example where a voltage is applied across the two diffused layers. An N+-type diffused layer 102 and a P+-type diffused layer 103 are formed in an N⁻-type semiconductor substrate 101 to provide a lateral diode. An insulating film 104 is formed on the substrate surface, and first and second wiring layers 105 and 106 are provided on the diffused layers 102 and 103, respectively. In this case, when a voltage is applied such that the first diffused layer 102 is provided with high voltage with respect to the second diffused layer 103, an electric field of the substrate 101 between the diffused layers 102 and 103 is uniformly distributed, thereby providing equipotential lines 107 (dotted line) having equal intervals. In this case, a breakdown voltage is determined by a point exceeding the critical potential density (avalanche breakdown) of silicon.

However, since a large number of wiring layers are required for the power semiconductor integrated circuit device, a portion of them must pass through semiconductor regions having different potentials. FIG. 9A shows a case where the first wiring layer 105 extending from the first diffused layer 102 passes over the second diffused layer 103 having a potential difference of about several hundreds volts or more. When a reverse bias voltage is applied between the first and second diffused layers 102 and 103, the electric field is concentrated at a portion surrounded by a circle (electric field concentration portion 108) where the second diffused layer 103 is crossed by the first wiring layer 105, as indicated by the equipotential lines 107. As shown in FIG. 9B, the potential of the semiconductor substrate 101 is abruptly changed near the second diffused layer 103, i.e., at a portion where the electric field is concentrated. When the electric field concentration density exceeds a critical point of the breakdown voltage of the semiconductor substrate 101, breakdown occurs due to the concentration of the electric field. Therefore, a desired breakdown voltage cannot be obtained.

Referring to FIG. 10, there will be described a semiconductor device that includes a P+-type diffused layer 122 and an N+-type diffused layer 123 formed in an N⁻-type semiconductor substrate 121, an insulating film 124 formed on the substrate surface, and a wiring layer 125 extending from the first diffused layer 122 and passing over the second diffused layer 123. A voltage is applied to the semiconductor device such that a potential difference between the first and second diffused layers 122 and 123 is several hundreds volts or more and the first diffused layer 122 has a low voltage with respect to the second diffused layer 123. In this case, equipotential lines 107 are concentrated to the N⁻-N+ interface (a portion indicated by a circle 108), thereby causing the breakdown.

At any rate, as shown in FIGS. 9A and 10, when a wiring layer passes over a diffused layer having a different potential, an electric field is concentrated at a portion of the device thereby reducing the breakdown voltage. For this reason, the following techniques have been proposed for increasing the breakdown voltage.

One of the techniques is that thickness of the insulating film 104 under the wiring layer 105 is increased as shown in FIG. 11. The electric field in the insulating film 104 is then easily relieved to reduce the concentration of the electric field in the semiconductor substrate 101. This technique can be applied to the process steps in making the semiconductor device without using new materials. However, the lateral type high breakdown voltage devices are generally used for integrated circuits, and are often provided in the same semiconductor substrate together with signal processing circuits having a low breakdown voltage and a small size. As shown in FIG. 11, if the insulating layer is thick, a contact hole formed in the insulating layer must be tapered. Therefore, a margin for taper processing is required in proportion to the thickness of the insulating layer. Consequently, the increase in thickness of the insulating layer will increase, e.g., the size of the signal processing circuits, thereby reducing the integration density of the overall integrated circuit device.

Another technique will be described below with reference to FIG. 12. A resistor, formed of semi-insulating polysilicon (to be referred to as SIPOS hereinafter) 109, having a high resistance, is formed in the insulating film 104 under the wiring layer 105. Opposite ends of the SIPOS 109 are connected to the first and second diffused layers 102 and 103, respectively, and are maintained at the electric potential thereof. The SIPOS 109 is a resistor having a high resistance, and the electric potential is uniformly distributed by the potential difference between both ends of the SIPOS 109. As indicated by the equipotential lines 107, the electric field is almost uniformly distributed in the semiconductor substrate 101 under the SIPOS 109. Therefore, the breakdown voltage can be increased to be approximately equal to the ideal breakdown voltage of the substrate. However, since the semi-insulating polysilicon is not normally used for the semiconductor device, the number of process steps is increased which therefore will increase the cost.

Still another technique will be described below with reference to FIGS. 13A and 13B. As shown in FIG. 13A, floating potential polysilicon layers 110 are fragmentarily arranged in the insulating film 104 under the wiring layer 105. As shown in FIG. 13B, the floating potential polysilicon layers 110 are arranged in parallel in the form of strips under the wiring layer 105. Each of the floating potential polysilicon layers 110 serves as a field plate, and the potential of each of the floating potential polysilicon layers 110 is fixed to a predetermined potential due to the influence of a leakage electric field from the semiconductor substrate 101. Therefore, the electric field is not concentrated and is uniformly distributed under the floating potential polysilicon layers 110, thereby obtaining an electric field distribution indicated by equipotential lines 107 in FIG. 13A.

According to the above technique, the cost is not increased because the integration density is not decreased and new materials are not used. However, the potential of each of the field plates is affected by the arrangement and shape of the field plates, the impurity concentration of the semiconductor substrate, the applied voltage, and the like. For this reason, the field plates must be optimally designed by using a computer in advance. A satisfactory effect therefore cannot be obtained without an optimal design. Even if the field plates are optimally designed at a certain potential, the potential variation makes it very difficult to perform the optimal design under all the conditions. Therefore, difficulties in the design of the field plates exist.

As described above, when a high-voltage wiring layer passes over a diffused layer having a potential difference of several hundreds volts or more, an electric field is concentrated to cause a breakdown. Therefore, a predetermined breakdown voltage cannot be obtained.

SUMMARY OF THE INVENTION

It is, therefore, an object of the present invention to provide an improved power semiconductor integrated circuit device having a wiring layer maintained at an electric potential different from that of an element region.

It is another object of the present invention to provide a power semiconductor integrated circuit device without deteriorating a breakdown voltage of a junction.

It is still another object of the present invention to provide a power semiconductor integrated circuit device which is less affected by an impurity concentration of a semiconductor substrate and an applied voltage.

According to one aspect of the present invention, there is provided a power semiconductor integrated circuit device, which comprises a semiconductor substrate of a first conductivity type, a first semiconductor region of a second conductivity type provided in the semiconductor substrate, a second semiconductor region of the first conductivity type provided in the semiconductor substrate to be spaced apart from the first semiconductor region, an insulating film provided over the semiconductor substrate, a wiring layer provided on the insulating film to be connected to one of the first and second semiconductor regions and to pass over the other of the first and second semiconductor regions, and a film resistor buried in the insulating film to be connected between the first and second semiconductor regions, and further being disposed to be crossed by the wiring layer at least once.

BRIEF DESCRIPTION OF THE DRAWINGS

The novel and distinctive features of the invention are set forth in the claims appended to the present application. The invention itself, however, together with further objects and advantages thereof may best be understood by reference to the following description and accompanying drawings in which:

FIG. 2A is a plan view showing a lateral diode having a high voltage wiring layer and a resistor for protecting a junction according to a second embodiment of the present invention;

FIG. 2B is a sectional view showing the lateral diode along a line IIB—IIB in FIG. 2A;

FIG. 6 is a sectional view schematically showing a lateral IGBT except the high voltage wiring layer according to a sixth embodiment of the present invention;

FIG. 7A is a sectional view showing a lateral diode having a high voltage wiring layer and a resistor for protecting a junction according to a seventh embodiment of the present invention;

FIG. 7B is a graph showing an electric potential distribution of the resistor in FIG. 7A;

DETAILED DESCRIPTION OF THE PREFERRED EMBODIMENTS

Figure 1A:
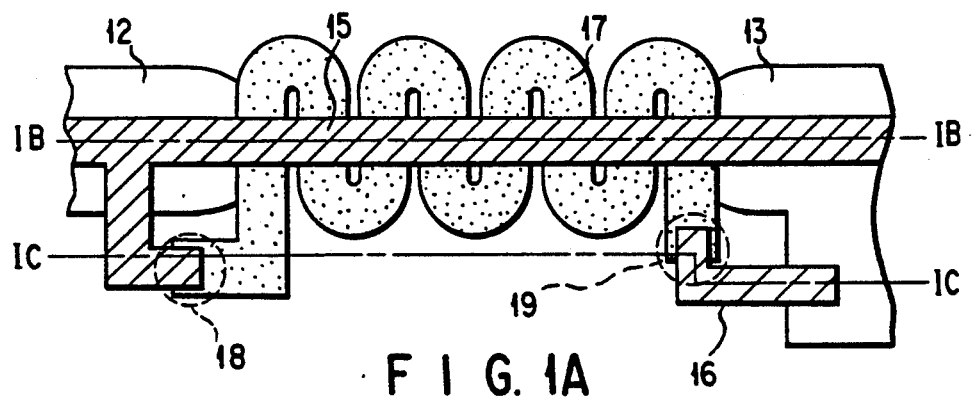
FIG. 1A is a plan view showing a lateral diode having a high voltage wiring layer and a resistor for protecting a junction according to a first embodiment of the present invention.

Embodiments of the present invention will be described below with reference to the accompanying drawings. The same reference numerals denote the same elements throughout the drawings.

The first embodiment will be described below with reference to FIGS. 1A to 1D. As shown in FIG. 1B, a semiconductor device according to the present invention is a lateral diode having a pn junction, and includes an $N^+$-type diffused layer 12 and a $P^+$-type diffused layer 13 formed in an $N^-$-type semiconductor substrate 11, an insulating film 14 provided over the substrate surface, a first wiring layer 15 connected to the first diffused layer 12 and passing over the second diffused layer 13, a second wiring layer 16 connected to the second diffused layer 13, and a resistor 17 of polysilicon arranged in the insulating film 14 to be crossed by the first wiring layer 15 and connected between the first and second diffused layers 12 and 13.

Figure 1B:
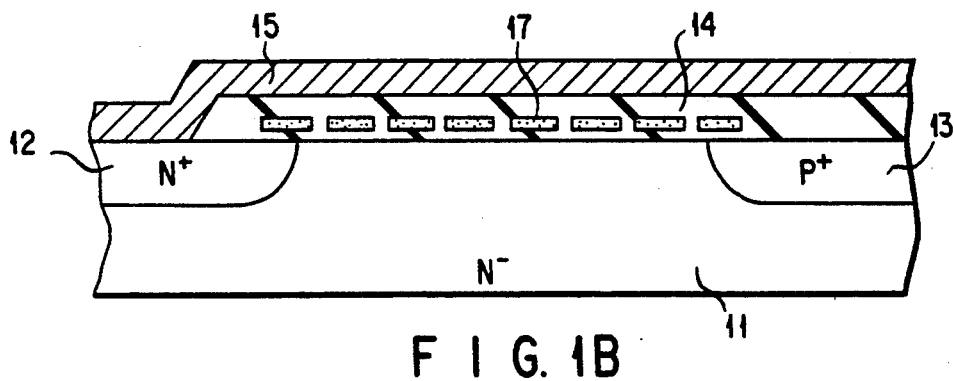
FIG. 1B is a sectional view showing the lateral diode along a line IB—IB in FIG. 1A.
Figure 1C:
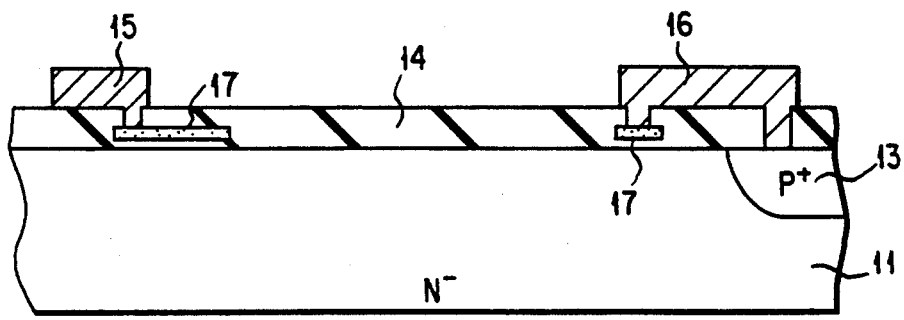
FIG. 1C is a sectional view showing the lateral diode along a line IC—IC in FIG. 1A.

As is apparent from FIG. 1A, the resistor 17 is continuously formed to be crossed by the first wiring layer 15 at least once, e.g., 8 times. As shown in FIG. 1B (the section along a line IB—IB), the resistor 17 is provided to have a zigzag or corrugated structure just under the first wiring layer 15. As shown in FIG. 1C (the section along a line IC—IC), one end of the resistor 17 is connected to the first wiring layer 15 at a first contact portion 18, while the other end of the resistor 17 is connected to the second wiring layer 16 at a second contact portion 19. Opposite ends of the resistor 17 are connected between the first and second diffused layers 12 and 13.

Figure 1D:
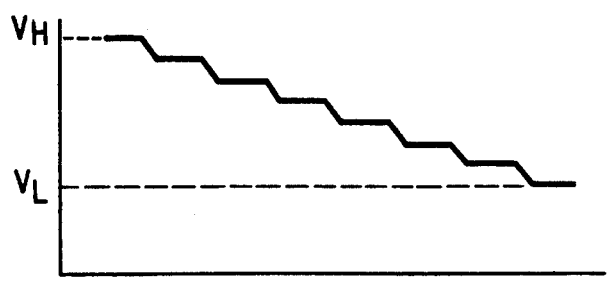
FIG. 1D is a graph showing an electric potential distribution of the resistor in FIG. 1B.

When a reverse voltage is applied between the first and second diffused layers 12 and 13, the resistor 17 exhibits a potential gradient as shown in FIG. 1D. The portions of the resistor 17 under the first wiring layer 15 have predetermined potentials, respectively, and the potential of the resistor 17 is gradually decreased from the first diffused layer 12, maintained at a high potential, to the second diffused layer 13 maintained at a low potential. That is, since both ends of the resistor 17 are set at the potentials of the first and second diffused layers 12 and 13, respectively, each portion of the resistor 17 is fixed to a predetermined potential, corresponding to a distance from the diffused layer 12 or 13. Therefore, the concentration of the electric field, which occurs when the first wiring layer 15 passes through the second diffused layer 13, can be avoided.

In this case, a small leakage current may flow through the resistor 17 because the resistor 17 is connected between the first and second diffused layers 12 and 13. However, since the resistor 17 is formed to be bent many times in the embodiment to obtain a sufficient length, the leakage current can be significantly reduced.

The second embodiment of the present invention will be described below with reference to FIGS. 2A and 2B. Only those portions which are different from the first embodiment will be described. As shown in FIG. 2A, the first diffused layer 12 is arranged inside the resistor 17, while the second diffused layer 13 is arranged outside the resistor 17, and the resistor 17 is provided to surround the first diffused layer 12 and to have a swirl-shaped structure. Opposite ends of the resistor 17 are fixed to the potentials of the first and second diffused layers 12 and 13 at first and second contact portions 18 and 19, respectively. In the drawings, reference numeral 21 denotes a contact layer for connecting the first diffused layer 12 to the resistor 17. As shown in FIG. 2B, the portions of the resistor 17 under the first wiring layer 15 are spaced apart from one another.

Since the resistor 17 has the swirl-shaped structure, the total length thereof can be increased, thereby reducing the leakage current. In addition, regardless of the direction in which the first wiring layer 15 extends, the same advantages described above can be obtained because the resistor 17 is provided to surround the first diffused layer 12.

In both the first and second embodiments, the width of the resistor cannot be decreased to a limit value or less in consideration of the design and process. Therefore, it is necessary to increase the length of the resistor as much as possible in order to increase the resistance thereof.

Figure 3A:
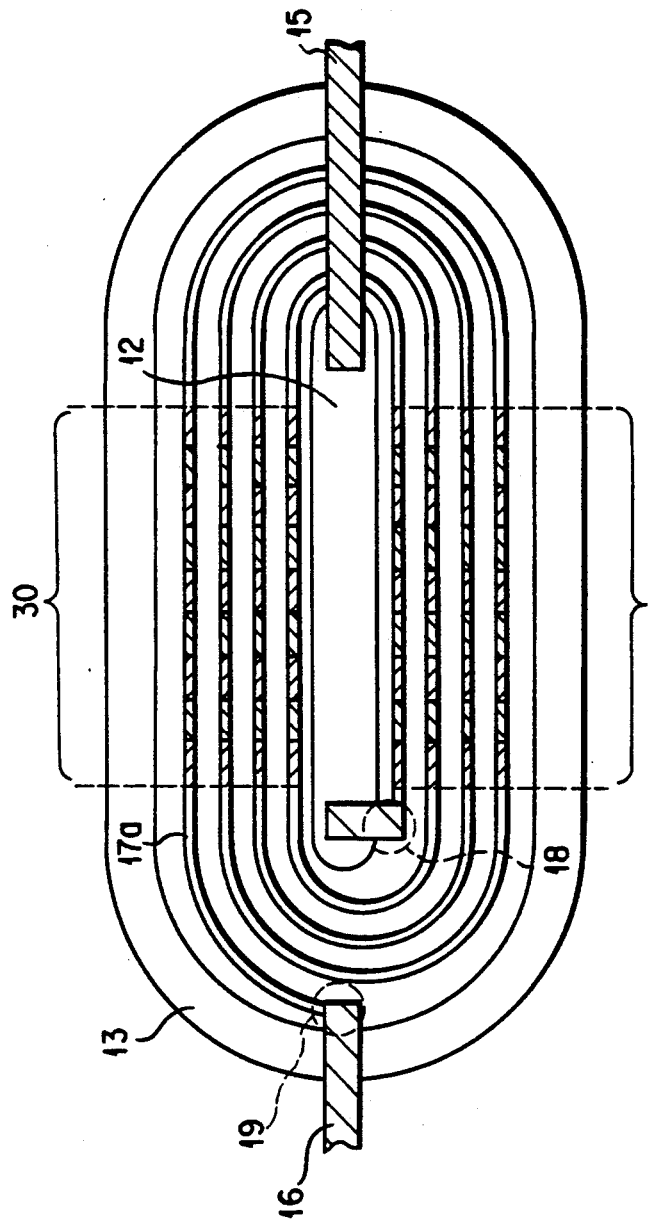
FIG. 3A is a plan view showing a lateral diode having a high voltage wiring layer and a resistor constituted by a plurality of diodes for protecting a junction according to a third embodiment of the present invention.
Figure 3B:
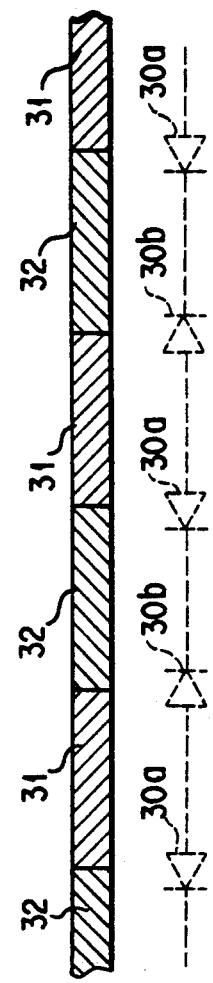
FIG. 3B is a view schematically showing the resistor provided by a plurality of diodes in FIG. 3A.

The third embodiment of the present invention will be described below with reference to FIGS. 3A and 3B. In the embodiment, as shown in FIG. 3A, a resistor 17a, formed of polysilicon, having diodes connected in series is used as a resistor. As shown in FIG. 3B, diodes 30 included in the resistor 17a are obtained by alternately connecting P-type regions 31 and N-type regions 32 in series, and the diodes (30a, 30b, 30a, ...) are alternately connected in forward and reverse directions.

With the above structure, only a small leakage current flows through reverse-biased diodes. This leakage current is generally maintained at a value less than a current flowing through a resistor formed by the same impurity concentration when the same voltage is applied thereto. Therefore, the leakage current can be greatly reduced as compared with a resistor consisting of only polysilicon. However, when a voltage applied to each of the reverse-biased diodes exceeds the breakdown voltage of the corresponding diode, an excessive current may flow through the diode. For this reason, an appropriate number of diodes must be connected in series to divide the voltage. For example, when a resistor having a breakdown voltage of 500 V is used, 100 or more diodes having an anti-series connection may be required if the breakdown voltage of one diode is 5 V.

The length of the resistor of the third embodiment can be made shorter than that of the resistor including no diodes because of the high resistance. Therefore, the resistor of the third embodiment is effective when a space for locating the resistor cannot be provided due to the small size of the chip.

Figure 4A:
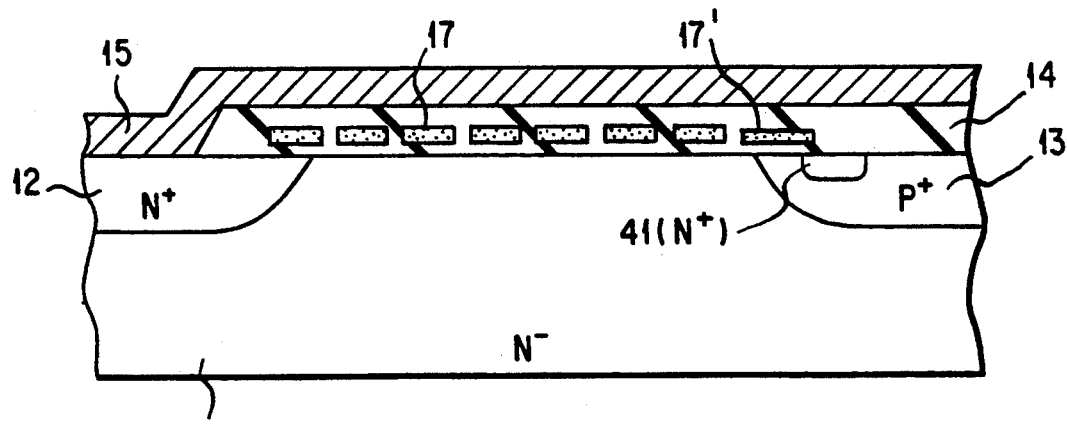
FIG. 4A is a sectional view showing a lateral double-diffusion MOS FET (DMOS FET) having a high voltage wiring layer according to a fourth embodiment of the present invention.

The fourth embodiment of the present invention applied to a lateral MOSFET (lateral DMOS FET) will be described below with reference to FIGS. 4A and 4B. As shown in FIG. 4A, an $N^+$-type third diffused layer 41 serving as a source region is provided in the second diffused layer 13, and an outer portion 17' of the resistor 17 is used as a gate electrode. The thickness of the insulating film 14 under the resistor portion 17' is thinner than that of the insulating film 14 under other resistor portions. A potential of volts several is applied to the gate electrode with respect to the potential of the source electrode and the second diffused layer. In the embodiment, one end of this resistor 17 is set at the potential of the first diffused layer 12, and the other end is set at the potential (e.g., a gate potential) close to a potential of the second diffused layer 13 or third diffused layer 41. The resistor 17' serving as the gate electrode has a potential difference of several volts with respect to the second diffused layer 13 which is maintained at a low potential, and has a potential difference of several hundreds volts or more with respect to the first diffused layer 12. Therefore, the resistor 17 functions as the gate electrode, and relieves the concentration of the electric field in the semiconductor substrate at the same time.

Figure 4B:
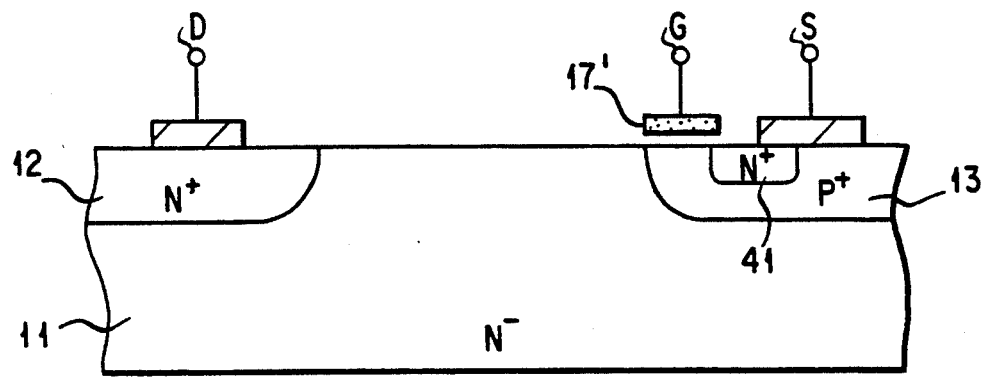
FIG. 4B is a sectional view schematically showing the lateral double-diffusion MOS FET (DMOS FET) except the high voltage wiring layer in FIG. 4A.

As shown in FIG. 4B, the first diffused layer 12, the resistor 17' and the third diffused layer 41 are connected to the drain electrode (D), the gate electrode (G) and the source electrode (S), respectively. FIG. 4B shows schematically the semiconductor device in FIG. 4A, and the insulating film 14, the resistor 17, and the first wiring layer 15 are omitted.

Figure 5:
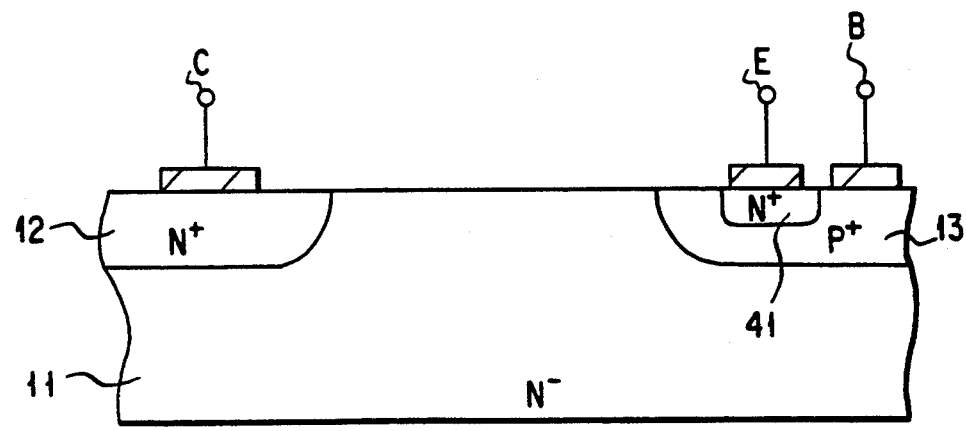
FIG. 5 is a sectional view schematically showing a lateral NPN bipolar transistor except the high voltage wiring layer according to a fifth embodiment of the present invention.
Figure 8:
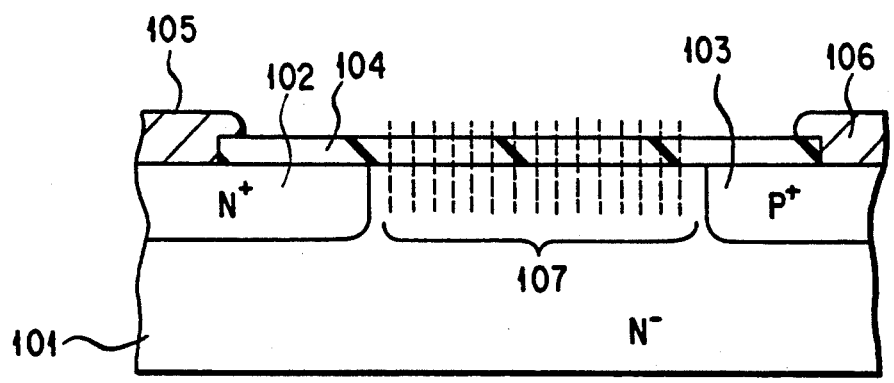
FIG. 8 is a sectional view showing a conventional lateral diode when a voltage is applied between two diffused layers.
Figure 9A:
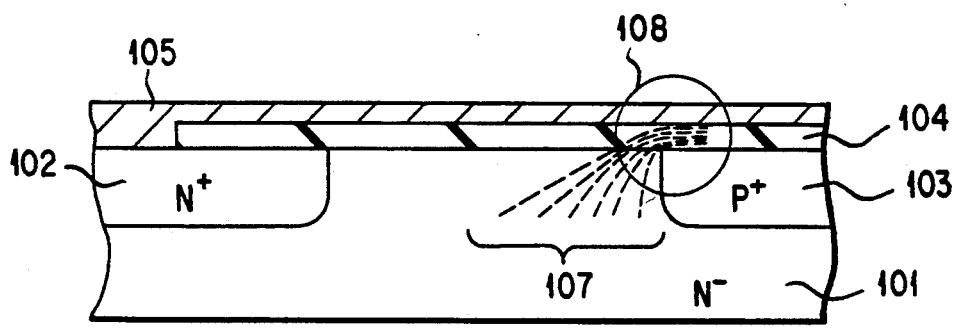
FIG. 9A is a sectional view showing an electric field distribution when a wiring layer formed on one of the diffused layers passes through the other of the diffused layers in FIG. 8.
Figure 9B:
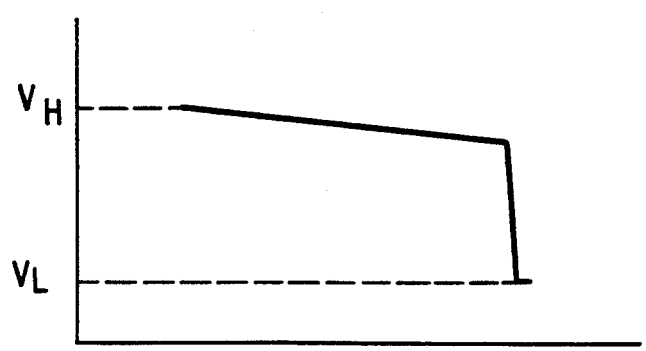
FIG. 9B is a graph showing an electric potential distribution of the semiconductor substrate in FIG. 9A.
Figure 10:
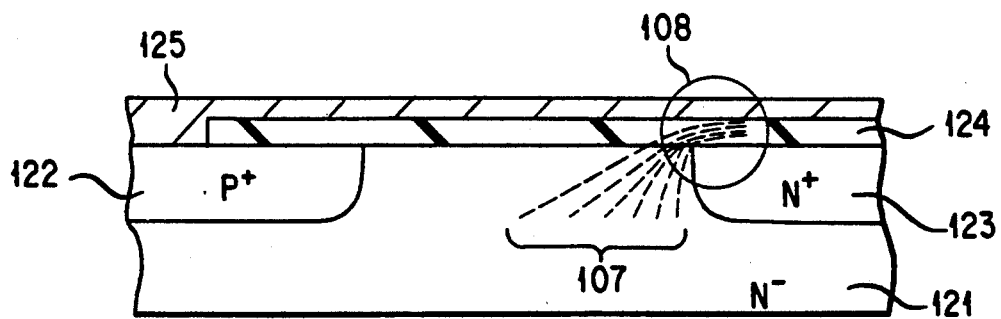
FIG. 10 is a sectional view showing an electric field distribution when a voltage is applied between two diffused layers to a reverse direction in FIG. 9A.
Figure 11:
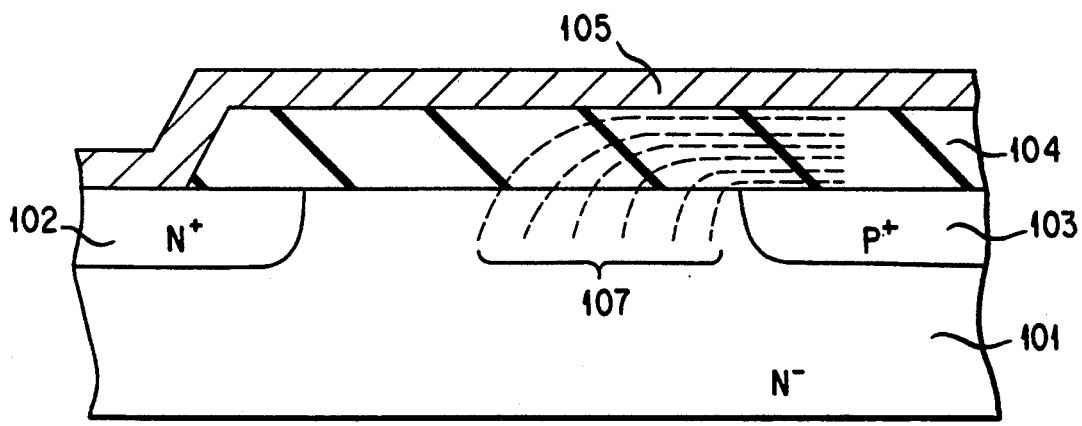
FIG. 11 is a sectional view showing a sectional view showing an electric field distribution when the thickness of an insulating layer under a wiring layer is increased.
Figure 12:
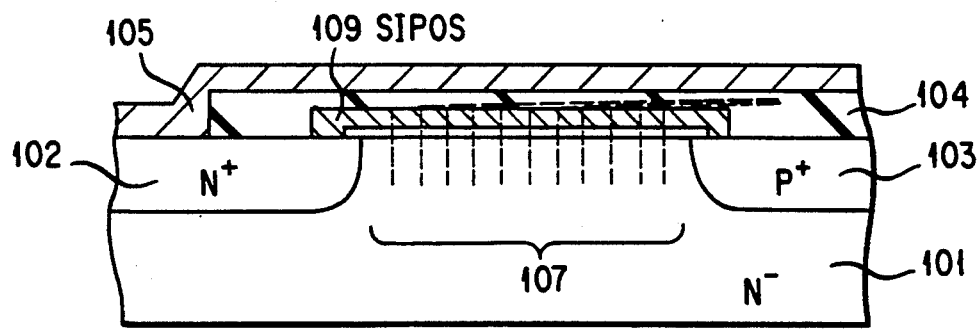
FIG. 12 is a sectional view showing a conventional breakdown protection structure, and illustrating an electric field distribution when a field plate of semi-insulating polysilicon is used.
Figure 13A:
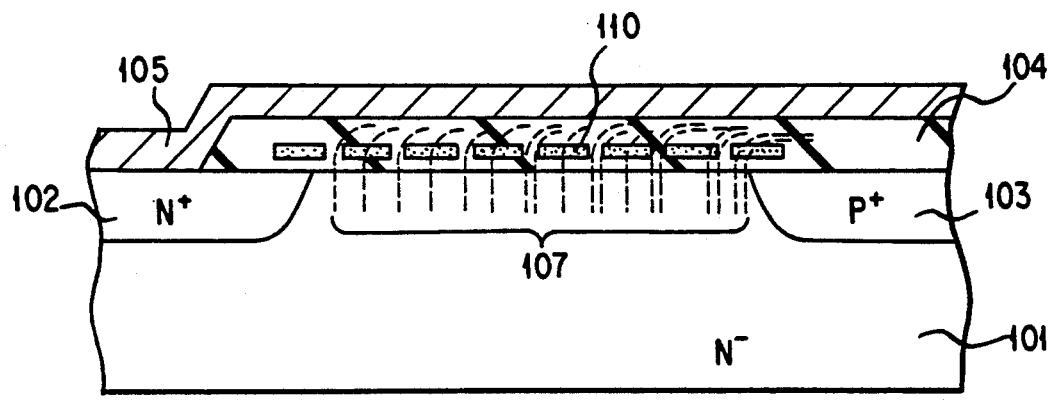
FIG. 13A is a sectional view showing another conventional breakdown protection structure, and illustrating an electric field distribution when field plates of floating potential semi-insulating polysilicon are used.
Figure 13B:
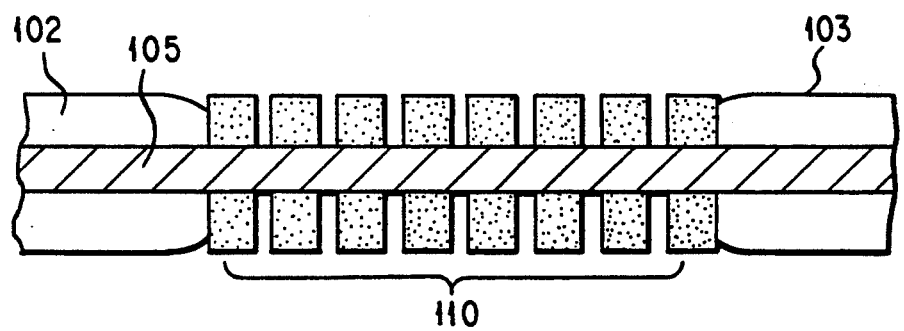
FIG. 13B is a plan view showing the field plates of floating potential semi-insulating polysilicon in FIG. 13A.

The fifth embodiment of the present invention applied to an NPN bipolar transistor will be described below with reference to FIG. 5. Since the basic structure is similar to the fourth embodiment, FIG. 5 is schematically shown as in FIG. 4B, and the high voltage wiring layer 15 and the resistor 17 are omitted. The first diffused layer 12, the second diffused layer 13 and the third diffused layer 41 are connected to the collector electrode (C), the base electrode (B), and the emitter electrode (E), respectively. In this case, one end of the resistor (not shown) is connected to the collector electrode (C), and the other end is connected to the base or emitter region. The outermost portion (corresponding to the resistor portion 17' in FIG. 4) of the resistor may be formed as in the first to third embodiments, or the insulating film under the outermost portion may be made thin.

The sixth embodiment of the present invention applied to an IGBT will be described below with reference to FIG. 6. FIG. 6 is schematically shown as in FIG. 5. A P+-type diffused layer 61, the resistor 17' and the third diffused layer 41 are connected to the collector electrode (C), the gate electrode (G) and the emitter electrode (E), respectively. At this time, one end of a resistor 17 (not shown) is connected to the collector electrode (C), and the other end is connected to the gate electrode (G) or the emitter electrode (E).

The seventh embodiment of the present invention will be described below. As shown in FIG. 7A, a semiconductor device includes a P+-type first diffused layer 72 and an N+-type second diffused layer 73, which are formed in an N−-type semiconductor substrate 71 to provide a lateral diode, an insulating film 74 formed on the substrate surface, a first wiring layer 75 connected to the first diffused layer 72 to pass through the second diffused layer 73, and a resistor 77 of polysilicon formed in the insulating film 74 to be crossed by the first wiring layer 75. In this case, as in the first embodiment, the resistor 77 is continuously formed to be crossed by the first wiring layer 75 at least once, e.g., 8 times, and both ends of the resistor 77 are set to the potentials of the first and second diffused layers 72 and 73, respectively. When a voltage is applied such that the first diffused layer 72 and the second diffused layer 73 are applied with low and high voltages, respectively, the potential of the resistor 77 is gradually increased from the first diffused layer 72 of the low potential to the second diffused layer 73 of the high potential as shown in FIG. 7B. Therefore, the semiconductor substrate 71 is shielded from the first wiring layer 75 by the resistor 77. Accordingly, the concentration of the electric field which occurs at the interface between the semiconductor substrate 71 and the second diffused layer 73 when the first wiring layer 75 passes through the second diffused layer 73 having the potential different from that of the first wiring layer 75, can be avoided.

The modification of the first embodiment has been described above with reference to FIG. 7. However, it is apparent that the technical concept of the seventh embodiment is applicable to another embodiments. That is, the resistor according to the present invention can be applied to any structure where a wiring layer passes over a diffused layer having a potential different from that of the wiring layer.

According to the present invention, since opposite ends of the resistor are set at the potentials of the diffused layers, respectively, each portion of the resistor is fixed to a predetermined potential, corresponding to the distance from the ends of the resistor. Therefore, the PN junction or interface formed in the semiconductor substrate can be advantageously shielded from the high voltage wiring layer. That is, since the electric field is uniformly distributed in the semiconductor substrate under the resistor, the breakdown voltage of the semiconductor element can be increased without concentrating the electric field even if the high voltage wiring layer passes over the diffused layer. In addition, the resistor can not be affected by impurity ions in the insulating film because the potentials of the resistor are not fixed by the leaked electric field from the semiconductor substrate, but are fixed by the diffused layers. A complex optimized design is not required in forming the resistor. When the resistor is formed by not only polysilicon but also a plurality of diodes, the resistance of the resistor can be greatly increased.

It is further understood by those skilled in the art that the foregoing description is only of the preferred embodiments and that various changes and modifications may be made in the invention without departing from the spirit and scope thereof.

What is claimed is:

1. A power semiconductor integrated circuit device comprising:
   a semiconductor substrate of a first conductivity type;
   a first semiconductor region of said first conductivity type provided in said semiconductor substrate;
   a second semiconductor region of a second conductivity type provided in said semiconductor substrate to be spaced apart from said first semiconductor region;
   an insulating film provided on said semiconductor substrate to cover at least partly said first and second semiconductor regions;
   a wiring layer provided on said insulating film to be connected to one of said first and second semiconductor regions and to extend over the other of said first and second semiconductor regions; and
   a film resistor formed in said insulating film to be connected between said first and second semiconductor regions, said film resistor being disposed above said semiconductor substrate to be crossed by said wiring layer at least once.

2. The device according to claim 1, wherein said film resistor has a length which is sufficient to reduce a leakage current flowing therethrough.

3. The device according to claim 1, wherein said film resistor is disposed above said semiconductor substrate and overlaps said first and second semiconductor regions.

4. The device according to claim 1, wherein said film resistor has a corrugated structure.

5. The device according to claim 1, wherein said wiring layer crosses said film resistor in a zig zag pattern.

6. The device according to claim 1, wherein said film resistor is a swirl-shaped structure.

7. The device according to claim 1, wherein said film resistor comprises a plurality of diodes composed of polysilicon.

8. The device according to claim 7, wherein said plurality of diodes is connected in series with one another so as to be alternately connected in forward and reverse directions.

9. The device according to claim 1, wherein said second semiconductor region is provided in said semiconductor substrate to surround said first semiconductor region.

10. The device according to claim 1, wherein a high voltage is applied to said first semiconductor region.

11. A power semiconductor integrated circuit device comprising:
- a semiconductor substrate of a first conductivity type;
- a first semiconductor region of said first conductivity type provided in said semiconductor substrate;
- a second semiconductor region of a second conductivity type provided in said semiconductor substrate to be spaced apart from said first semiconductor region;
- a third semiconductor region of said first conductivity type provided in said second semiconductor region;
- an insulating film provided on said semiconductor substrate to cover at least partly said first, second and third semiconductor regions;
- a wiring layer provided on said insulating film to be connected to one of said first semiconductor region and to extend over said second semiconductor region; and
- a film resistor buried in said insulating film, said film resistor being disposed above said semiconductor substrate to be crossed by said wiring layer at least once, one end of said film resistor being connected to said first semiconductor region, the other end of said film resistor being arranged between said semiconductor substrate and said third semiconductor region above a portion of said second semiconductor region.

12. The device according to claim 11, wherein said film resistor is composed of a polysilicon material having a high resistivity.

13. A power semiconductor integrated circuit device comprising:
- a semiconductor substrate of a first conductivity type;
- a first semiconductor region of said first conductivity type provided in said semiconductor substrate;
- a second semiconductor region of a second conductivity type provided in said semiconductor substrate to be spaced apart from said first semiconductor region;
- a third semiconductor region of said first conductivity type provided in said second semiconductor region;
- an insulating film provided on said semiconductor substrate to cover at least partly said first, second and third semiconductor regions;
- a wiring layer provided on said insulating film to be connected to said first semiconductor region and to extend over said second semiconductor region; and
- a film resistor buried in said insulating film, said film resistor being disposed above said semiconductor substrate to be crossed by said wiring layer at least once, one end of said film resistor being connected to said first semiconductor region, the other end of said film resistor being connected to one of said second and third semiconductor regions.

14. A power semiconductor integrated circuit device comprising:
- a semiconductor substrate of a first conductivity type;
- a first semiconductor region of a second conductivity type provided in said semiconductor substrate;
- a second semiconductor region of said second conductivity type provided in said semiconductor substrate to be spaced apart from said first semiconductor region;
- a third semiconductor region of said first conductivity type provided in said second semiconductor region;
- an insulating film provided on said semiconductor substrate to cover at least partly said first, second and third semiconductor regions;
- a wiring layer provided on said insulating film to be connected to said first semiconductor region and to extend over said second semiconductor region; and
- a film resistor buried in said insulating film, said film resistor being disposed above said semiconductor substrate to be crossed by said wiring layer at least once, one end of said film resistor being connected to said first semiconductor region, the other end of said film resistor being arranged between said semiconductor substrate and said third semiconductor region above a portion of said second semiconductor region.

* * * * *